US010692778B2

(12) United States Patent
Bao et al.

(10) Patent No.: US 10,692,778 B2
(45) Date of Patent: Jun. 23, 2020

(54) GATE-ALL-AROUND FETS HAVING UNIFORM THRESHOLD VOLTAGE

(71) Applicant: INTERNATIONAL BUSINESS MACHINES CORPORATION, Armonk, NY (US)

(72) Inventors: Ruqiang Bao, Niskayuna, NY (US); Dechao Guo, Niskayuna, NY (US); Junli Wang, Slingerlands, NY (US); Heng Wu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/051,833

(22) Filed: Aug. 1, 2018

(65) Prior Publication Data
US 2020/0043808 A1 Feb. 6, 2020

(51) Int. Cl.
*H01L 29/423* (2006.01)
*H01L 21/8238* (2006.01)
(Continued)

(52) U.S. Cl.
CPC ........... *H01L 21/823842* (2013.01); *H01L 21/28088* (2013.01); *H01L 21/3215* (2013.01); *H01L 21/823821* (2013.01); *H01L 27/0924* (2013.01); *H01L 29/0673* (2013.01); *H01L 29/42392* (2013.01); *H01L 29/7853* (2013.01)

(58) Field of Classification Search
CPC ........... H01L 29/42392; H01L 29/0665; H01L 29/0669; H01L 29/0673; H01L 29/0676; H01L 2924/13061; H01L 21/823842; Y10S 977/938
See application file for complete search history.

(56) References Cited

U.S. PATENT DOCUMENTS 9,685,522 B1 6/2017 Kim et al.
9,997,519 B1 * 6/2018 Bao .................. H01L 27/092
(Continued)

OTHER PUBLICATIONS

Bagga et al., "Analytical Threshold Voltage Model of Gate All Around Triple Metal Tunnel FET," Abstract, 10.1109/ICEDSS.2017. 8073674, IEEE, https://ieeexplore.ieee.org/document/8073674/, Accessed on: Jun. 5, 2018.
(Continued)

*Primary Examiner* — Allen L Parker
*Assistant Examiner* — Gustavo G Ramallo
(74) *Attorney, Agent, or Firm* — Cantor Colburn LLP; Vazken Alexanian

(57) ABSTRACT

A technique relates to a semiconductor device. An N-type field effect transistor (NFET) and a P-type field effect transistor (PFET) each include an inner work function metal, an outer work function metal, a first nanosheet including an inner channel surface having a first threshold voltage, and a second nanosheet including an outer channel surface having a second threshold voltage. The outer work function metal is modified so as to cause the outer channel surface for the second nanosheet to have the second threshold voltage within a predefined amount of the first threshold voltage for the inner channel surface of the first nanosheet, the predefined amount being within about 20 millivolts (mV).

15 Claims, 14 Drawing Sheets

(51) Int. Cl.
*H01L 27/092* (2006.01)
*H01L 21/3215* (2006.01)
*H01L 21/28* (2006.01)
*H01L 29/78* (2006.01)
*H01L 29/06* (2006.01)

(56) References Cited

U.S. PATENT DOCUMENTS

| | | | |
|---|---|---|---|
| 10,374,034 B1* | 8/2019 | Liu | H01L 29/0665 |
| 2015/0243563 A1 | 8/2015 | Lee et al. | |
| 2015/0263004 A1* | 9/2015 | Cheon | H01L 29/4966 |
| | | | 257/392 |
| 2016/0111425 A1* | 4/2016 | Chen | H01L 27/0922 |
| | | | 257/369 |
| 2018/0308699 A1* | 10/2018 | Yeung | H01L 29/6656 |

OTHER PUBLICATIONS

Mertens et al., "Vertically Stacked Gate-All-Around Si Nanowire CMOS Transistors with Dual Work Function Metal Gates", Abstract, Introduction, 10.1109/IEDM.2016/838456; IEEE, https://ieeexplore.ieee.org/document/7838456/; Accessed on Jun. 5, 2018.

* cited by examiner

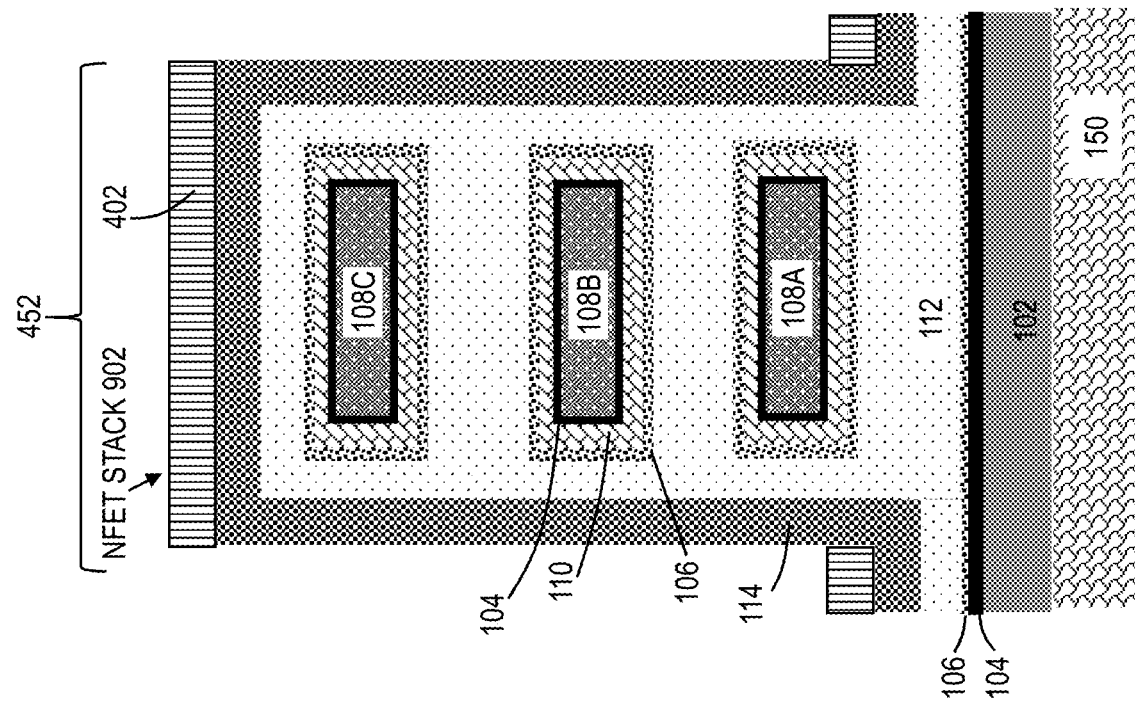
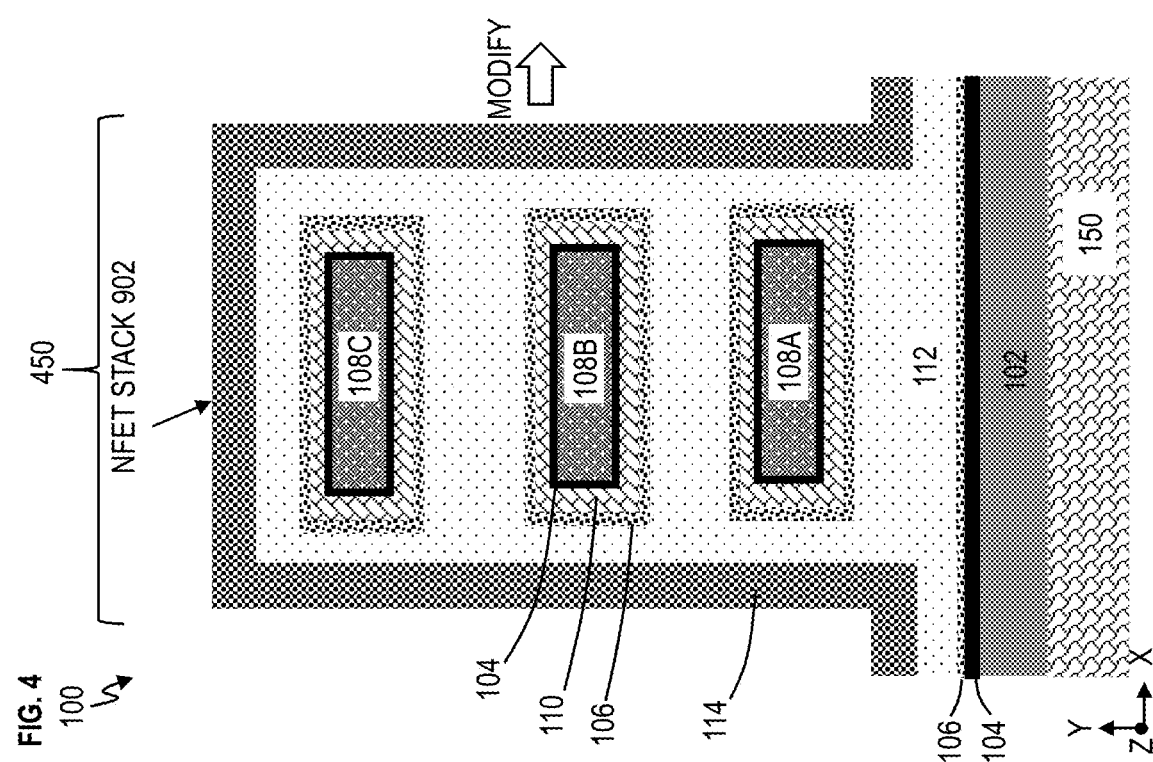
FIG. 4

PROVIDE AN N-TYPE FIELD EFFECT TRANSISTOR (NFET) AND A P-TYPE FIELD EFFECT TRANSISTOR (PFET), EACH INCLUDING AN INNER WORK FUNCTION METAL, AN OUTER WORK FUNCTION METAL, A FIRST NANOSHEET COMPRISING AN INNER CHANNEL SURFACE HAVING A FIRST THRESHOLD VOLTAGE, AND A SECOND NANOSHEET COMPRISING AN OUTER CHANNEL SURFACE HAVING A SECOND THRESHOLD VOLTAGE 1002

MODIFY THE OUTER WORK FUNCTION METAL SO AS TO CAUSE THE OUTER CHANNEL SURFACE FOR THE SECOND NANOSHEET TO HAVE THE SECOND THRESHOLD VOLTAGE WITHIN A PREDEFINED AMOUNT OF THE FIRST THRESHOLD VOLTAGE FOR THE INNER CHANNEL SURFACE OF THE FIRST NANOSHEET, THE PREDEFINED AMOUNT BEING WITHIN ABOUT 20 MILLIVOLTS (MV) 1004

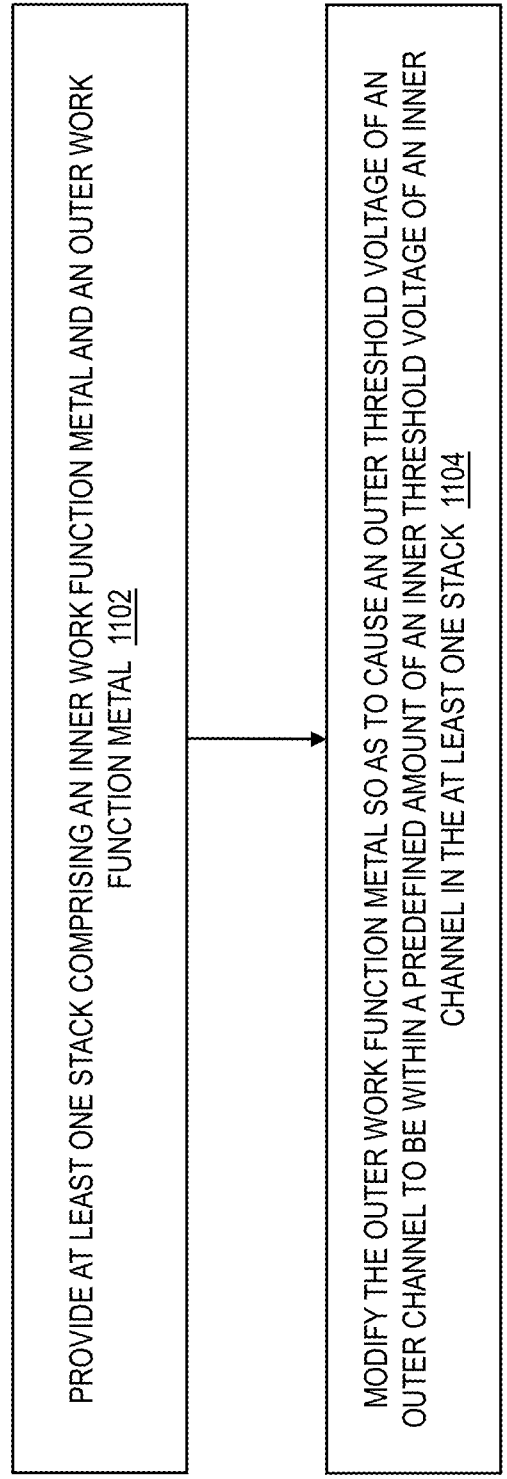

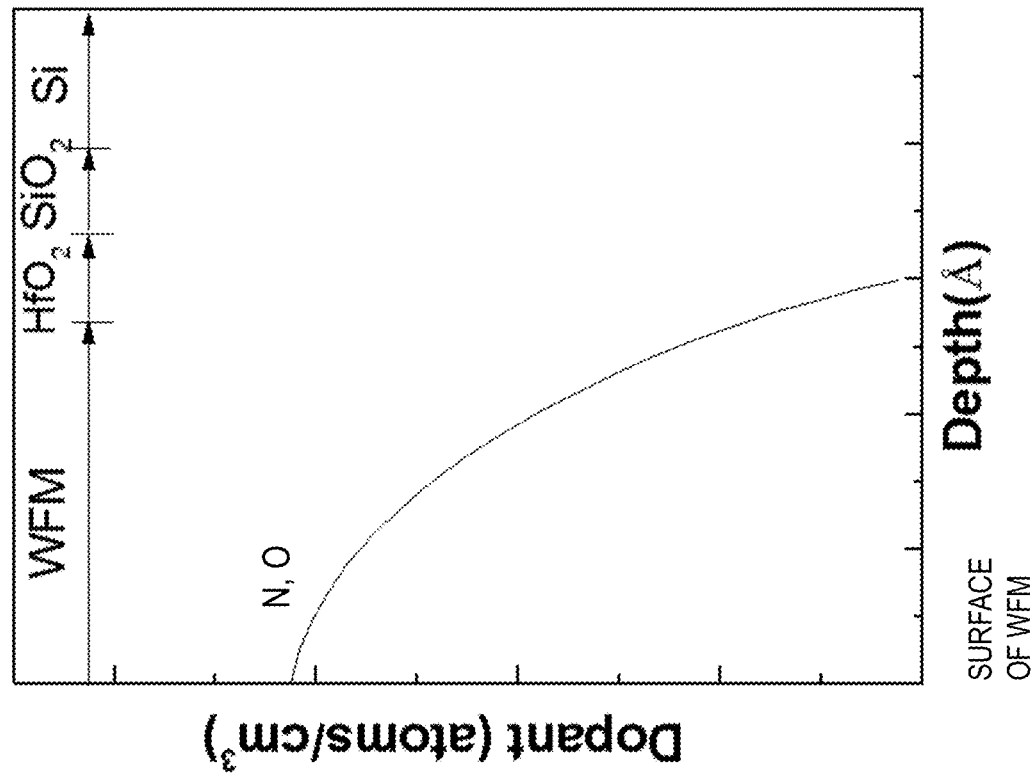
FIG. 12C

GATE-ALL-AROUND FETS HAVING UNIFORM THRESHOLD VOLTAGE

BACKGROUND

The present invention generally relates to fabrication methods and resulting structures for semiconductor devices, and more specifically, to gate-all-around FETs having uniform threshold voltage.

The MOSFET is a transistor used for amplifying or switching electronic signals. The MOSFET has a source, a drain, and a metal gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on").

N-type field effect transistors (NFET) and P-type field effect transistors (PFET) are two types of complementary MOSFETs. The NFET includes n-doped source and drain junctions and uses electrons as the current carriers. The PFET includes p-doped source and drain junctions and uses holes as the current carriers.

The nanowire or nanosheet MOSFET is a type of MOSFET that uses multiple stacked nanowires/nanosheets to form multiple channel regions. The gate regions of a nanosheet MOSFET are formed by wrapping gate stack materials around the multiple nanowire/nanosheet channels. This configuration is known as a gate-all-around (GAA) FET structure. The nanowire/nanosheet MOSFET device mitigates the effects of short channels and reduces drain-induced barrier lowering.

SUMMARY

Embodiments of the invention are directed to a method for fabricating a semiconductor device. A non-limiting example of the method includes providing an N-type field effect transistor (NFET) and a P-type field effect transistor (PFET), each including an inner work function metal, an outer work function metal, a first nanosheet including an inner channel surface having a first threshold voltage, and a second nanosheet including an outer channel surface having a second threshold voltage. Also, the method includes modifying the outer work function metal so as to cause the outer channel surface for the second nanosheet to have the second threshold voltage within a predefined amount of the first threshold voltage for the inner channel surface of the first nanosheet, the predefined amount being within about 20 millivolts (mV).

Embodiments of the invention are directed to a semiconductor device. A non-limiting example of the semiconductor device includes an N-type field effect transistor (NFET) and a P-type field effect transistor (PFET), each including an inner work function metal, an outer work function metal, a first nanosheet including an inner channel surface having a first threshold voltage, and a second nanosheet including an outer channel surface having a second threshold voltage. Also, the device includes additional material in the outer work function metal so as to cause the outer channel surface for the second nanosheet to have the second threshold voltage that is within a predefined amount of the first threshold voltage for the inner channel surface of the first nanosheet.

Embodiments of the invention are directed to a method of treating a gate-all-around field effect transistor. A non-limiting example of the method includes providing at least one stack including an inner work function metal and an outer work function metal. Also, the method includes modifying the outer work function metal so as to cause an outer threshold voltage of an outer channel to be within a predefined amount of an inner threshold voltage of an inner channel in the at least one stack.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 4 depicts the results of performing fabrication operations configured and arranged to modify the effective work function of the semiconductor device according to embodiments of the invention;

FIG. 10 depicts a flow chart of a method of fabricating the semiconductor device according to embodiments of the invention;

FIG. 11 depicts a flow chart of a method of treating the semiconductor device according to embodiments of the invention;

FIG. 12C depicts a chart according to according to embodiments of the invention.

Figure 1:
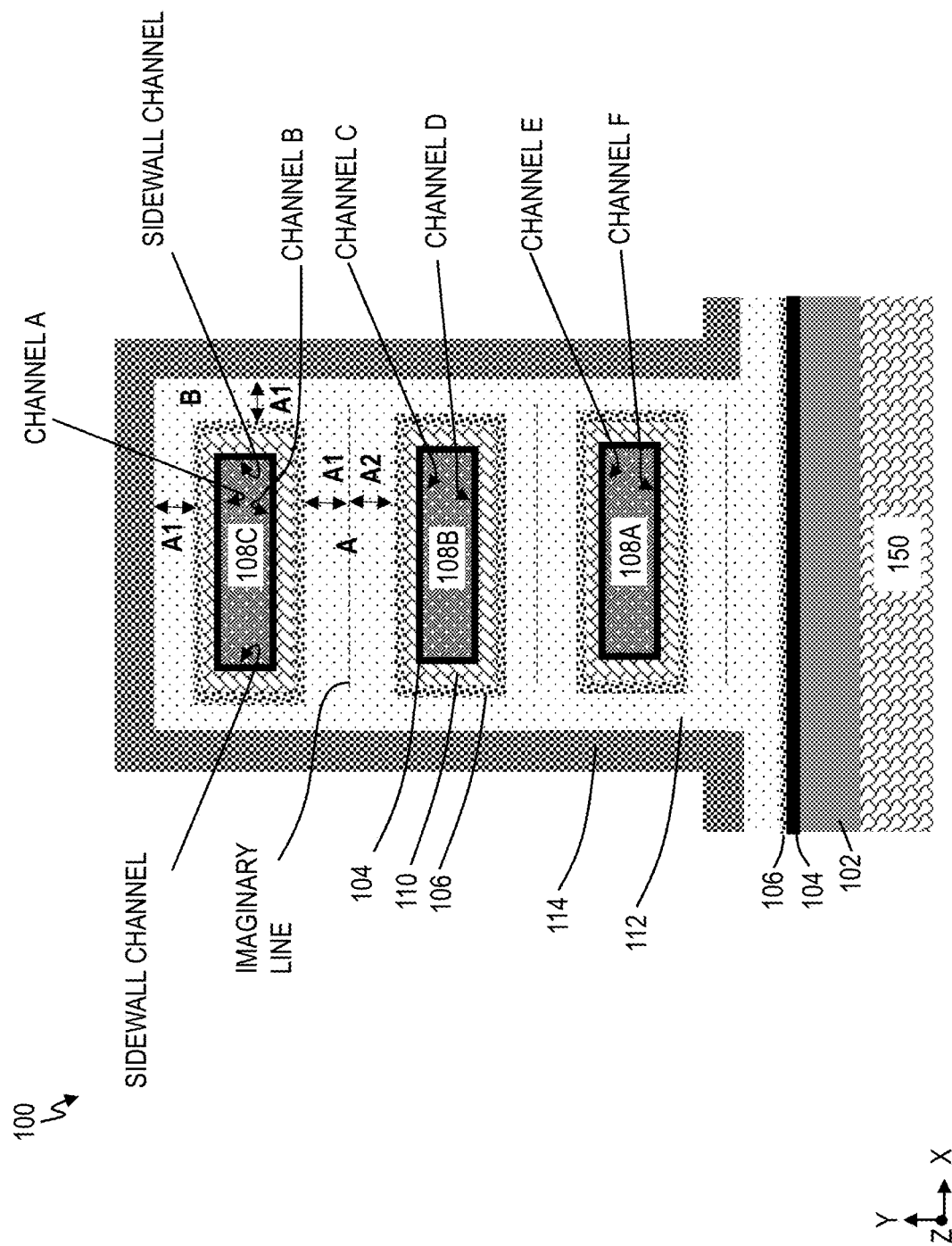
FIG. 1 depicts a cross-sectional view of semiconductor device according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, gate-all-around (GAA) nanosheet FET structures can provide superior electrostatics. In contrast to known Fin-type FET (FinFET) structures in which the fin element of the transistor extends "up" out of the transistor, nanosheet FET designs implement the fin as a silicon nanosheet/nanowire. In a known configuration of a GAA nanosheet FET, a relatively small FET footprint is provided by forming the channel region as a series of nano sheets (i.e., silicon nanowires). A known GAA configuration includes a source region, a drain region, and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. In GAA FETs (e.g., with three or more nanosheets), the device has a non-uniform threshold voltage around the nanosheets due to a different work function structure in the inner nanosheet versus the outside nanosheet. In the stacked nanosheet channels, each nanosheet channel has a threshold voltage which should be the same throughout the stack. Ideally, the same value for the threshold voltage (sometimes referred to as gate voltage) should be used to turn on the first nanosheet, second nanosheet, third nanosheet, etc. However, the threshold voltages particularly between the channel surfaces on a top nanosheet and channel surfaces on an inner nanosheet can differ, thereby causing the device to have a non-uniform threshold voltage. Also, the threshold voltages of channel surfaces on the top nanosheet can differ.

Turning now to an overview of the aspects of the invention, one or more embodiments of the invention address the above-described shortcomings of the prior art by providing a GAA nanosheet FET semiconductor device and a method of forming the semiconductor device with a uniform threshold voltage for each of the nano sheets, thereby making each of the nanosheets have the same value for their respective threshold voltages. The uniform threshold voltage is accomplished by modifying the outside nanosheet work function metal without impacting the inner sheet work function metal. The work function metal of the outside/top nanosheet can be modified by different treatments, such as, implantation, plasma treatment, and thermal anneal. This modification of the work function metal of the outside/top nanosheet causes the threshold voltage of the outer channel surfaces to be similar and/or the same as the threshold voltage of the inner channels.

Further, the work function metal in an outside region can have different materials and/or different elements from the work function metal in an inner region for both NFET and PFET for GAA nanosheet FETs. Using implantation, there can be more elements on the top surface than side wall of the nanosheet for both the NFET and PFET. Using plasma doping, there can be more elements on the top portion of the nanosheet and/or top nanosheet for both the NFET and PFET. Using thermal treatment (e.g., thermal doping), uniform elements (e.g., O and N) can be distributed along the outside region of the nanosheet. Also, using directional deposition, there can be additional materials added on the top surface and bottom of the outside/top nanosheet, which are different from inner/below nanosheet, thereby causing the threshold voltages of the outer channel surface and inner channel surface to be similar and/or the same.

Turning now to a more detailed description of aspects of the present invention, FIG. 1 depicts a cross-sectional view of semiconductor device 100 in which the effective work function will be modified to cause each of the nanosheet channels to have the same or substantially the same threshold voltage as discussed herein. The semiconductor device 100 is GAA nanosheet FET. A replacement metal gate (RMG) process has been performed, as understood by one skilled in the art. The semiconductor device 100 includes a bottom isolation material 102 formed on a substrate 150, and nanowires/nanosheets 108A, 108B, and 108C formed in a stack. The nanowires/nanosheets 108A, 108B, and 108C are separated by one or more high-k dielectric materials 110 and a first work function metal 112. The nanowires/nanosheets 108A, 108B, and 108C are wrapped in the high-k material 110. The nanowires/nanosheets 108A, 108B, and 108C can be referred to generally as nanowires/nanosheets. Although three nanowires/nanosheets 108A, 108B, and 108C are illustrated for explanation purposes, the stack can have two or more nanowires/nanosheets, such as 3, 4, 5, 6, etc.

Optionally, a thin interfacial layer 104 can surround the nanowires/nanosheets 108A, 108B, and 108C. The interfacial layer 104 can be formed between the high-k dielectric materials 110 and the nanowires/nanosheets 108A, 108B, and 108C. Example materials of the interfacial layer 104 can include silicon dioxide, silicon nitride, etc. Optionally, a bottom barrier layer 106 can be formed between the high-k dielectric material 110 and the first work function metal 112, such that the bottom barrier 106 surrounds the high-k dielectric material 110. Example materials of the thin bottom barrier layer 106 can include metal nitride such as titanium nitride, TaN, WN, and metal carbide such as TiC, WC, etc.

A second work function metal 114 is formed on top of the first work function metal 112. The type of work function metal(s) depends on the type of transistor and can differ between the NFET and the PFET. The first work function metal 112 and the second work function metal 114 can include n-type work function metal materials. The first work function metal 112 can be one type of material and the second work function metal 114 can be another type of material. In some embodiments, the first work function metal 112 can be the same type of material as the second work function metal 114. In some embodiments, the first work function metal 112 is n-type work function metal material for NFET and the metal layer 114 could be used as a cap layer to enable the first work function metal 112 patterning or protect the first work function metal 112 from being affected by the downstream processes. In some embodiments, a first work function metal 512 is p-type work function metal material for PFET, and a layer 514 (depicted in FIG. 5) could be a tri-layer NFET metal stack or more layer NFET metal stack. P-type work function materials include compositions such as ruthenium, palladium, platinum, cobalt, nickel, and conductive metal oxides, conductive nitrides such as TiN, conductive carbide such as TiC, and/or any combination thereof. N-type metal materials include compositions such as hafnium, zirconium, titanium, tantalum, aluminum, metal carbides (e.g., hafnium carbide, zirconium carbide, and aluminum carbide), TiAlC, aluminides, or any metallic Al or Ti containing metals or compounds or any combinations thereof.

Example materials for the nanosheet/nanowire layers 108 can include silicon. The nanosheet layers 108 can be doped or undoped. When doped, the nanosheet/nanowire layers can include "P" type dopants such as boron, aluminum, gallium, and indium, or "N" type dopants such as phosphorus, arsenic, antimony, etc. Other materials or combinations of materials can also be used. Other non-limiting examples of semiconductor materials for the nanosheet/nanowire layers 108 include strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. In some embodiments of the invention, the thickness of the nanosheet/nanowire layers 108 can be about 3 nm to about 20 nm thick. In some embodiments of the invention, the thickness of the nanosheet/nanowire layers 108 can be between about 10 nm to about 12 nm. Greater and smaller thicknesses are also contemplated.

The isolation material 102 can be, for example, an oxide material such as silicon dioxide ($SiO_2$) and a nitride insulator such as SiN. The high-k dielectric materials 110 can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The substrate 150 can encompasses semiconductor materials conventionally used in the semiconductor industry from which to make electrical devices. In embodiments of the invention, the starting substrate can be a semiconductor-on-insulator (SOI) substrate, which already includes the buried oxide layer. Alternatively, the starting substrate can be a bulk semiconductor including a sole semiconductor material or a combination of two or more semiconductor materials. The semiconductor material can include one or more monocrystalline silicon materials, such as the relatively pure or lightly impurity-doped monocrystalline silicon materials typically used in the semiconductor industry, as well as polycrystalline silicon materials, where silicon can be mixed with other elements such as carbon and the like. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. The semiconductor material also includes other materials such as relatively pure and impurity-doped gallium arsenide, germanium, gallium arsenide, gallium nitride, cadmium telluride, and zinc selenide, zinc oxide, glass, and the like. The substrate 150 can be a monocrystalline silicon material. The silicon substrate 150 can be a bulk silicon wafer or can be a thin layer of silicon disposed over an insulating layer (SOI) that, in turn, can be supported by a carrier wafer. The substrate 150 can be material consisting essentially of III-V compound semiconductors. Other suitable substrates can include II-VI compound.

In FIG. 1, the GAA nanosheet FET 100 is utilized to illustrate non-uniform threshold voltage around the top nanosheet 108C because of the different work function structure around the surfaces of the outside or top nanosheet 108C. Electrical current travels in the z-axis (mainly) along the surface of the nanosheets 108A, 108B, 108C and is affected by the effective work function. These surfaces on the nanosheets 108A, 108B, 108C are referred to as channels, channel surfaces, etc. For illustration purposes, in the region A, the effective work function is defined by (distance) A1 and A2, but in the region B, the effective work function is defined by A1 only. As a result, the channel B, C, D, E and F have a lower threshold voltage than channel A and the sidewall channel surface. The channel surfaces B, C, D, E and F are referred to as inner channels. However, channel A and the sidewall channel are referred to as outer channels. Also, channel surface A could also be referred as top channel as well. Therefore, the device performance could be affected by 10-16% due to less performance contributed by the nanosheet top surface (i.e., A1 at the top of outer channel A in the y-axis). An imaginary dashed line is illustrated for the seams formed due to the pinch-off of work function metals via atomic layer deposition. Various example processes are performed on the semiconductor device 100 to modify the effective work function thereby modifying the threshold voltage as discussed further herein. Various examples make comparisons between outer channels (e.g., channel A and sidewall channel) and inner channels (e.g., channels B, C, D, E, F) in nanosheets to illustrate how modifications to the effective work function causes the outer channels and inner channels to have the same threshold voltages according to embodiments of the invention. It should be appreciated that inner channels have the same threshold voltage prior to (and after) the modifications. The outer channels are modified to have the same threshold voltage as the inner channels. In some implementations, having the same threshold voltages can be within a predefined tolerance of, for example, 15 mV and/or 20 mV, such that a 15 mV difference or less (i.e., 0-15 mV difference) in threshold voltages between one channel and another channel is considered to be the "same" or such that a 20 mV difference or less (i.e., 0-20 mV difference) in threshold voltages between one channel and another channel is considered to be the "same".

It is noted that FIG. 1 depicts an NFET but the description applies by analogy to PFETs and illustrates the same outer channels and inner channels for PFETs. In PFET, the NFET work function metal stack, for example, consisting of three layers stack (e.g., which can be represented as layer 514 in FIG. 5) is usually deposited on PFET work function metal 512 which could be only one layer metal. When PFET work function metal is pinched off between the sheets, the NFET work function metal stack is only deposited on the sidewall and top surface, thus only affecting the sidewall and top surface threshold voltage. In such a case, the threshold voltage profile is very similar to what was previously described in FIG. 1 for NFET. In order to make the structure easy for understanding, only two layers (e.g., layers 512 and 514) are drawn for PFET. The top layer (e.g., layer 514) is used to represent the NFET stack which in reality could be only one layer, two layers, three layers, or more layers. In one or more embodiments, the top layer represents a three layers NFET stack. Also, channels A, B, C, D, E, F and sidewall channels are only labeled in FIG. 1 but not in FIGS. 2-9 so as not to obscure the figures. Although certain examples will identify outer channels (e.g., outer channel A and sidewall channel) on top nanosheet 108C versus inner channels C-F on nanosheets 108A and/or 108B for ease of understanding, it should be appreciated that embodiments of the invention apply to outer channel (e.g., outer channel A and sidewall channel) and inner channel B on the same nanosheet 108A.

Figure 2:
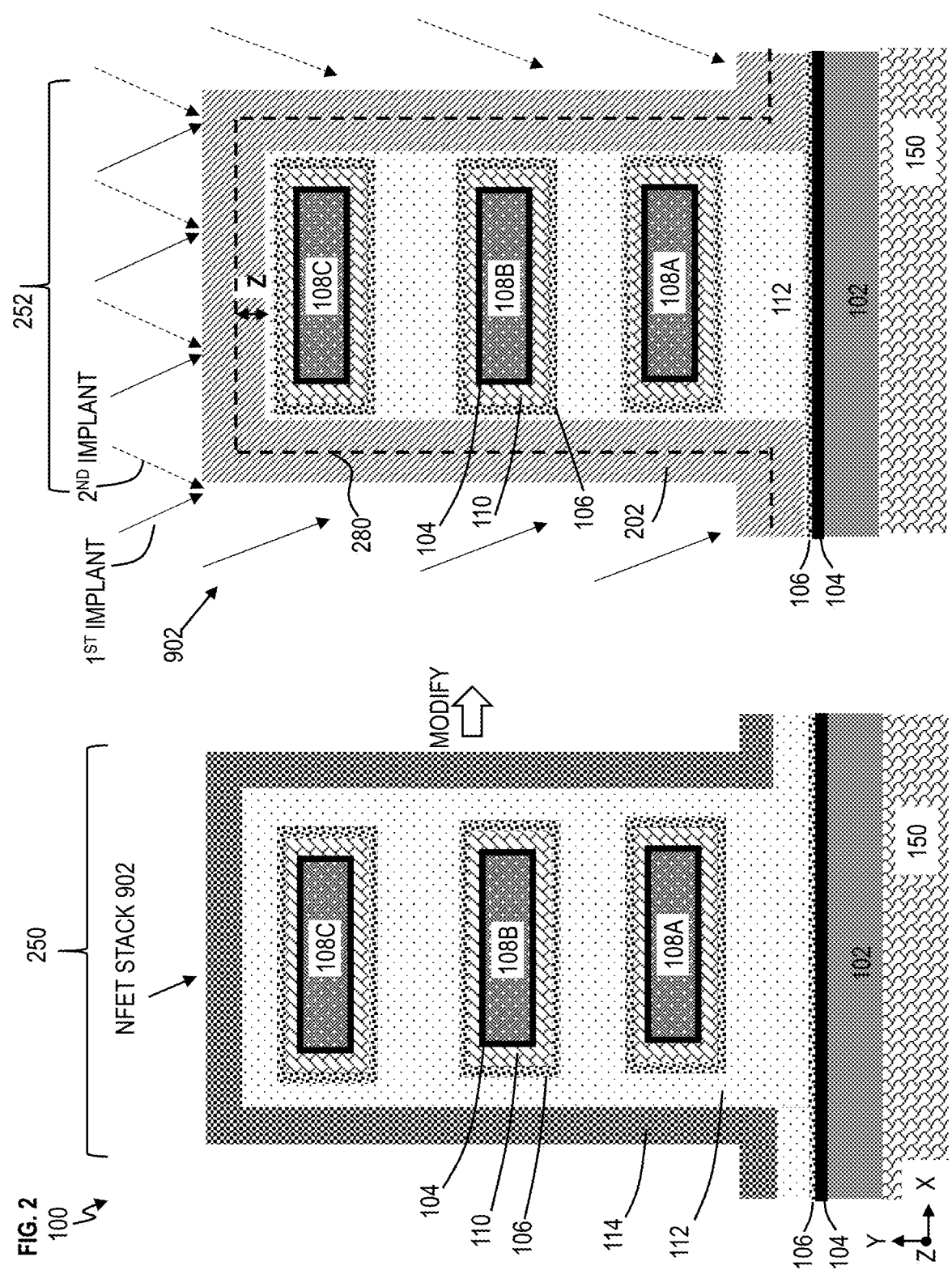
FIG. 2 depicts the results of performing fabrication operations configured and arranged to modify the effective work function of the semiconductor device according to embodiments of the invention.
Figure 3:
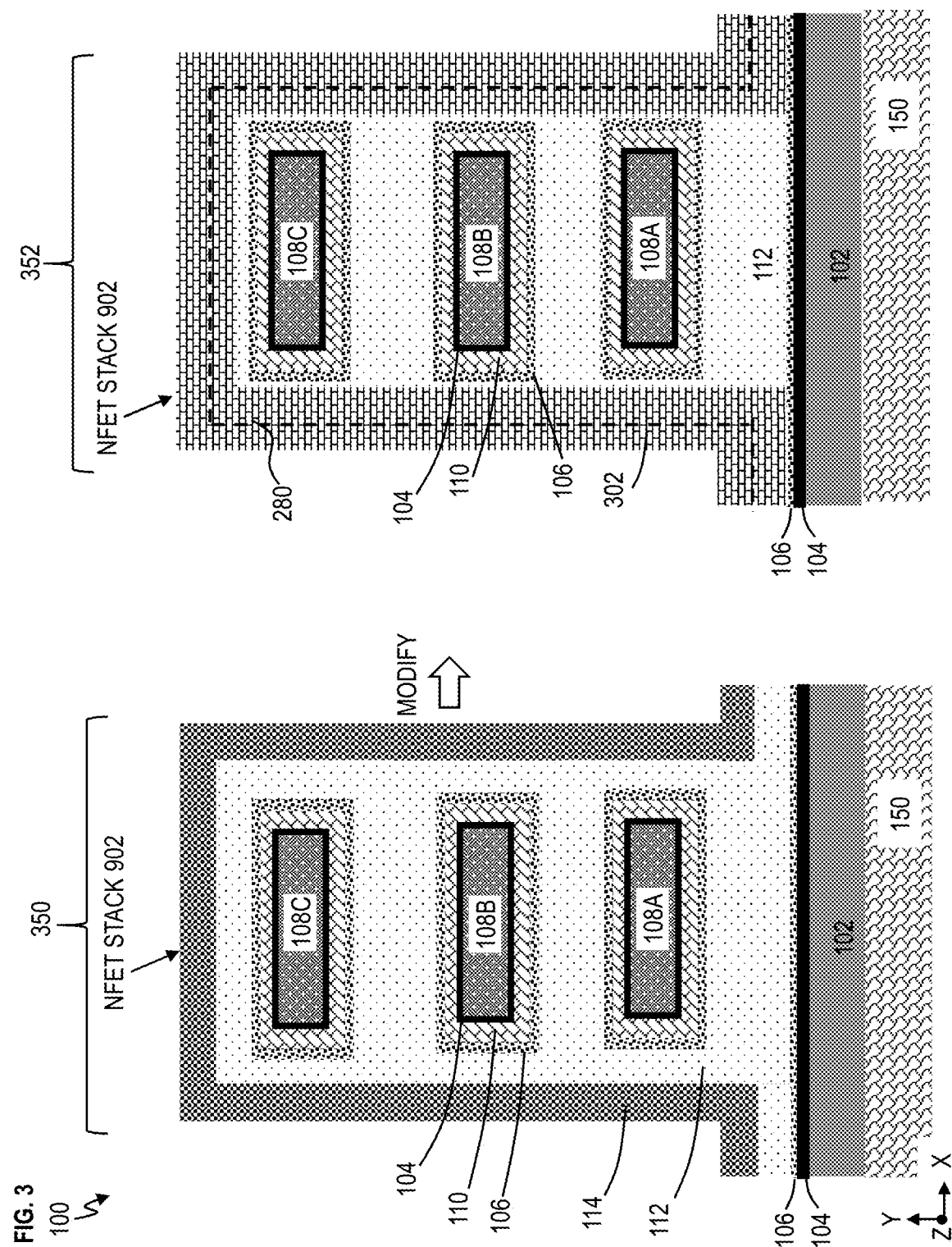
FIG. 3 depicts the results of performing fabrication operations configured and arranged to modify the effective work function of the semiconductor device according to embodiments of the invention.
Figure 8:
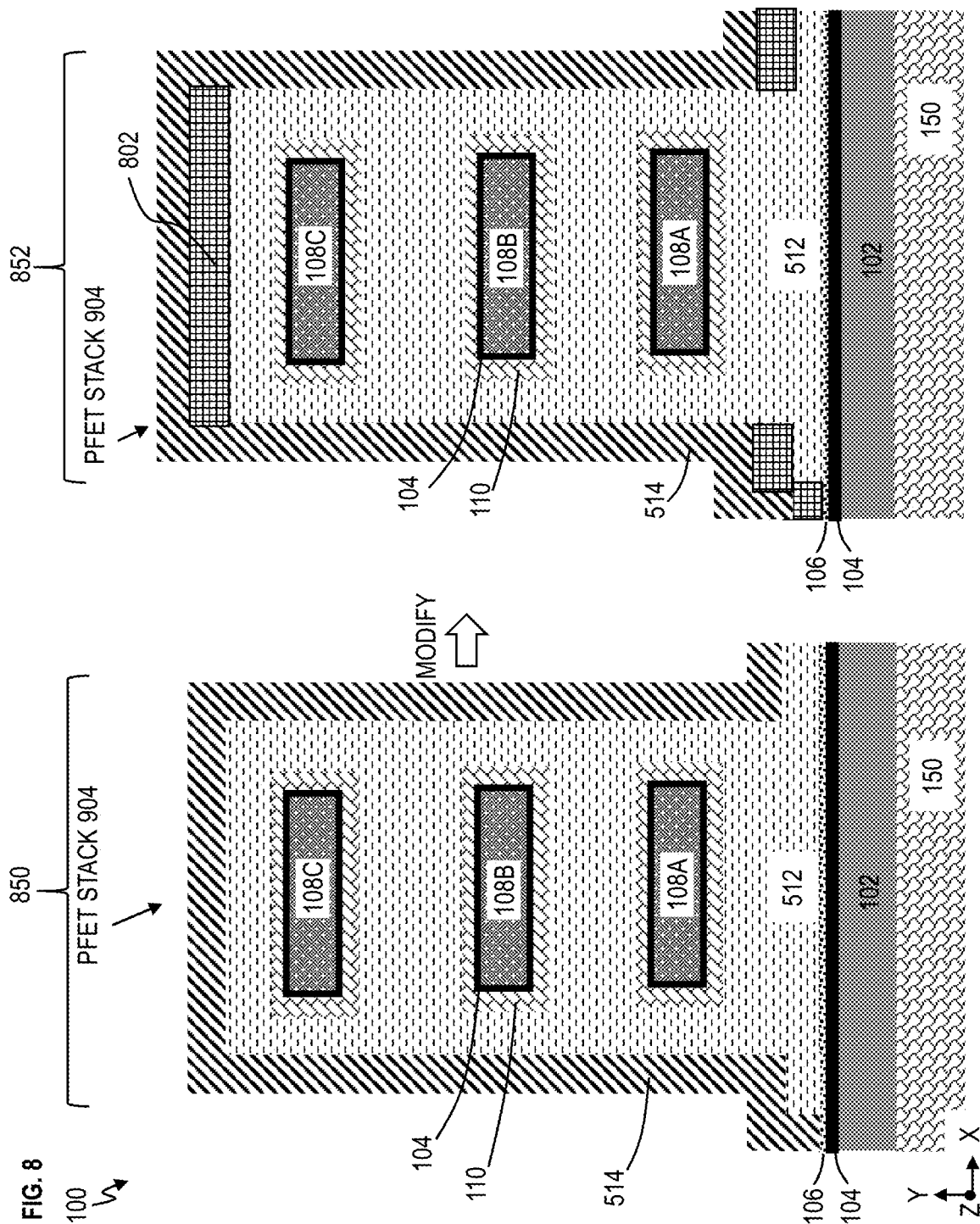
FIG. 8 depicts the results of performing fabrication operations configured and arranged to modify the effective work function of the semiconductor device according to embodiments of the invention.
Figure 9:
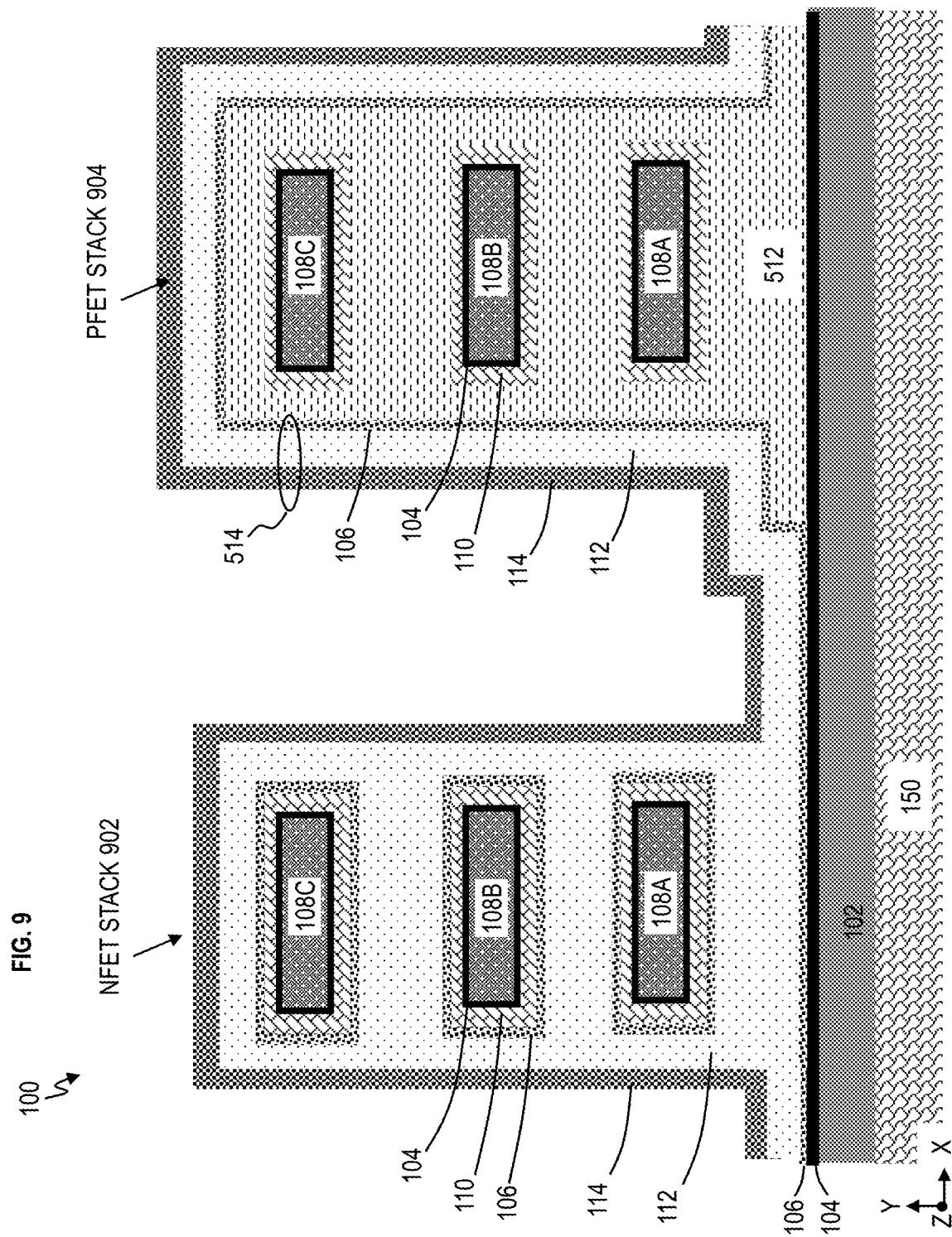
FIG. 9 depicts an example of the semiconductor device prior to modification of the effective work function in FIGS. 2-8, according to embodiments of the invention.

It should be appreciated that the semiconductor device 100 can include both a NFET and PFET formed side-by-side on the same substrate 150 as depicted in FIG. 9. Techniques to modify the effective work function of NFETs are depicted in FIGS. 2, 3, and 4. Techniques to modify the effective work function of PFETs are depicted in FIGS. 5, 6, 7, and 8. The NFET (on the NFET side) 902 can be modified on the same substrate 150 as the PFET (on the PFET side) 904, and vice versa.

FIG. 2 depicts modifying the effective work function of the semiconductor device 100 according to one or more embodiments of the invention. In this example, the work function of the NFET 902 is shown prior to modification in the left view 250 and after modification in the right view 252. Particularly, FIG. 2 illustrates modification of the second work function metal 114 using beam line implantation and/or ion implantation. In some implementations, a portion of the first work function metal 112 can also be modified, and in other implementations, only the second work function metal 114 is modified. This is a pure scavenging metal implantation, and the atoms or ions used in the implantation can include Al, Ti, Hf, Zr, La, W, Mg and/or any other metals which can scavenge the oxygen from high k-dielectric etc. The metals are implanted in the second work function metal 114 (outside work function metal), and optionally, in a portion of the first work function metal 112 (inner work function metal), resulting in modified work function metal layer 202. The dashed line 280 represents the previous interface between the first and second work function metals 112 and 114 prior to modification, thereby illustrating that a portion of the first work function metal 112 can be modified. The distance Z represents the modified thickness of the metal 112. The implantation can include a first implant of ions/atoms in a first direction and a second implant of ions/atoms in a second direction to create the modified work function metal layer 202 (on the sidewall as well). In some embodiments, more than one element can be implanted into the work function metal 114 and 112. In some embodiments, more directions (like different implant angle and twist angle, varied species, different energy ions, etc.) are implanted.

The metal 112 and metal 114 can be different materials. As one example, the metal 112 is NFET work function metal like metallic Al containing metal and 114 can be TiN. After modification, the modified region 202 would be with a high concentration of Al, Ti, Hf, Zr, etc., atoms/ions. The atoms/ions can penetrate a depth of about 2-4 nanometers (nm) to form the modified work function metal layers stack 202. As can be seen, the modified work function metal layers stack 202 encompasses the (entirety of) second work function metal 112. In some implementations, the modified work function metal layers stack 202 can encompass a portion of the first work function metal 112, which results in the size of the original work function metal 112 (not having metal implanted) being reduced. For example, the modified thickness of work function metal 112 could be Z as shown in FIG. 2. By forming the modified work function metal layers stack 202, the modified NFET now has a uniform (or more uniform) threshold voltage. Particularly, the threshold voltages of the outer channel (e.g., channel A and sidewall channel) and inner channel (e.g., channels B, C, D, E, F) are the same (or substantially the same). Having threshold voltages that are substantially the same threshold voltage can be a predefined difference, such as, for example, a difference of about 10 millivolts (mV) to 20 mV (or less). In some implementations, the predefined difference can be less than about 10 mV between the threshold voltages. As a result of this work function modification, the effective work function of the outer channel is lowered which correspondingly lowers the threshold voltage of the outer channel so as to match (or nearly match) the inner channel. For example, threshold voltage of channel A of the top nanosheet 108C matches (or nearly matches) the threshold voltage of respective channels B-F of nanosheets 108A and 108B. The work function modification does not increase the threshold voltage of the inner channel (of nano sheets 108A and 108B). Rather, the implanted elements, such as, e.g., Al, enhance the capability of the metal layer to scavenge the oxygen from the high k-dielectric and form oxygen vacancies which lower the effective work function of the metal thereby lowering the threshold voltage of the outer channel. In some embodiments, the implanted elements could not be uniform to surround the outer nanosheet, for example, top nanosheet 108C could have more implanted elements than the sidewall.

FIG. 3 depicts modifying the effective work function of the semiconductor device 100 according to one or more embodiments of the invention. In this example, the work function of the NFET 902 is shown prior to modification in the left view 350 and after modification in the right view 352. Particularly, FIG. 3 illustrates modification of the metal 114 using metal plasma implantation or plasma treatment. In some implementations, a portion of the work function metal 112 can also be modified, and in other implementation, only the metal 114 is modified. As one example, the dashed line 280 represents the previous interface between the first and second work function metals 112 and 114 prior to modification, thereby illustrating that a portion of the first work function metal 112 can be modified. The atoms or ions used in the implantation can include Al, Ti, Hf, Zr, La, W, Mg and/or any other metals which can scavenge the oxygen from high k-dielectric. The metals are implanted in the metal 114 (outside work function metal) and optionally in a portion of the first work function metal 112 (inner work function metal), resulting in modified work function metal layer 302.

The atoms/ions can penetrate a depth of 2-4 nanometers (nm) to form the modified work function metal layer 302. As one example, the first work function metal 112 can be metallic Al containing metal and layer 114 can be TiN. After modification, the modified work function metal layer 302 would be TiN with a high concentration of Al, Ti, Hf, Zr, etc., atoms/ions. As can be seen, the modified work function metal layer 302 encompasses the (entirety of) second work function metal 112. In some implementations, the modified work function metal layer 302 can optionally encompass a portion of the first work function metal 112, which results in the size of the original first work function metal 112 (not having metal implanted) being reduced. By forming the modified work function metal layer 302, the modified NFET now has a uniform (or more uniform) threshold voltage. Particularly, the threshold voltages of the outer channel (e.g., channel A and sidewall channel) and inner channel (e.g., channels B, C, D, E, F) are the same (or substantially the same). As a result of this work function modification, the effective work function of the outer channel is lowered which correspondingly lowers the threshold voltage of the outer channel so as to match (or nearly match) the inner channel. For example, threshold voltage of channel A of the top nanosheet 108C matches (or nearly matches) the threshold voltage of respective channels B-F of nanosheets 108A and 108B. The work function modification does not increase the threshold voltage of the inner channel (of nanosheets 108A and 108B).

In some implementations, the work function can be modified using both types of implantation, i.e., using metal ion/atom implantation in FIG. 2 and metal plasma implantation/treatment in FIG. 3. One type of implantation can occur first and the other type can occur next, or vice versa.

FIG. 4 depicts modifying the effective work function of the semiconductor device 100 according to one or more embodiments of the invention. Yet another example of modifying the work function of the NFET 902 is illustrated, in which NFET 902 is shown prior to modification in the left view 450 and after modification in the right view 452. A directional deposition technique is used to modify the effective work function. The material deposited can include Al, Ti, Hf, Zr, La, W, Mg and/or any other metals which can scavenge the oxygen from high k-dielectric. One or more metals are deposited on top of the metal 114 (outside work function metal), resulting in modified work function metal layer 402. The additional work function metal layer 402 is (only) formed on the top surface of the metal 114 above the outer channel (e.g., top channel A) but not the sidewalls of the stack. Particularly, the additional work function metal layer 402 grows in the y-axis because of the directional deposition. The height/thickness of the additional work function metal layer 402 ranges from about 2-5 nanometers in order to form the modified NFET which now has a uniform (or more uniform) threshold voltage. Consequently, the threshold voltages of the outer channel (e.g., channel A) and inner channel (e.g., channels B, C, D, E, F) are the same (or substantially the same). As a result of this work function modification, the effective work function of the top channel is lowered which correspondingly lowers the threshold voltage of the outer channel so as to match (or nearly match) the inner channel. In one or more embodiments, the top metal layer 402 can be implemented by vertical implantation.

The work function modification does not increase the threshold voltage of the inner channel (of nanosheets 108A and 108B). In some embodiments, the layer 402 can be directionally deposited on top first work function metal 112 prior to depositing second work function metal 114. In this case, the metals 112 and 114 would sandwich layer 402 in between.

Figure 5:
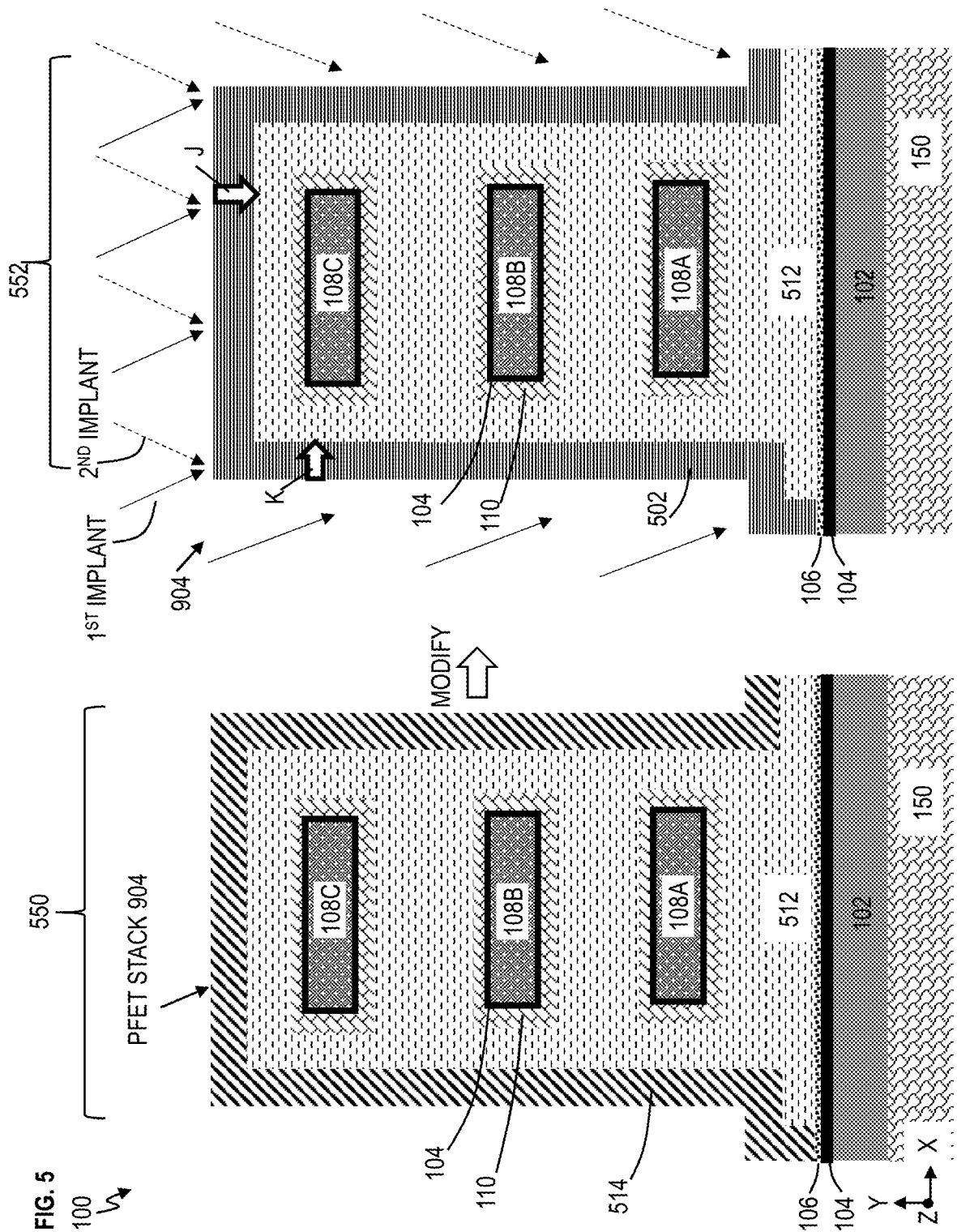
FIG. 5 depicts the results of performing fabrication operations configured and arranged to modify the effective work function of the semiconductor device according to embodiments of the invention.

FIG. 5 depicts modifying the effective work function of the semiconductor device 100 according to one or more embodiments of the invention. In this example, the work function of the PFET 904 is shown prior to modification in the left view 550 and after modification in the right view 552. Particularly, FIG. 5 illustrates modification of the layer 514 using beam line implantation and/or ion implantation. In some implementations, a portion of the metal 512 can also be modified, and in other implementations, only the metal 514 is modified. The atoms or ions used in the implantation can include O, N, Cl, F, etc. The atoms/ions are implanted in the metal 114 (outside work function metal) and optionally in a portion of the first work function metal 512 (inner work function metal), resulting in modified work function metal layer 502. The implantation can include a first implant of ions/atoms in a first direction and a second implant of ions/atoms in a second direction to create the modified work function metal layer 502. In some embodiments, more directions (like different implant angle and twist angle, varied species, different energy ions, etc.) are implanted.

As one example, the metal 512 can be TiN and the 514 can be an NFET stack like tri-layer stack described in FIG. 1, and the modified work function metal layer stack 502 would be with a high concentration of O, N, Cl, F, etc., atoms/ions so that the NFET work function stack has high work function and cannot affect the work function of metal 512. The atoms/ions can penetrate a depth of 2-4 nanometers (nm) to form the modified work function metal layer 502. As can be seen, the modified work function metal layer 502 encompasses the (entirety of) work function metal 512. In some implementations, the modified work function metal layer 502 can encompass a portion of the work function metal 512, which results in the size of the original work function metal 512 (not having atoms/ions implanted) being reduced. By forming the modified work function metal layer 502, the modified PFET now has a uniform (or more uniform) threshold voltage. Particularly, the threshold voltages of the outer channel (e.g., channel A and sidewall channel) and inner channel (e.g., channels B, C, D, E, F) are the same (or substantially the same). Having threshold voltages that are substantially the same threshold voltage can be a predefined difference, such as, for example, a difference of about 10 millivolts (mV) to 20 mV (or less). In some implementations, the predefined difference can be less than about 10 mV between the threshold voltages. As a result of this work function modification, the effective work function of the outer channel is lowered which correspondingly lowers the threshold voltage of the outer channel so as to match (or nearly match) the inner channel. For example, threshold voltage of channel A of the top nanosheet 108C matches (or nearly matches) the threshold voltage of respective channels B-F of nanosheets 108A and 108B. The work function modification does not increase the threshold voltage of the inner channel (of nano sheets 108A and 108B).

Figure 6:
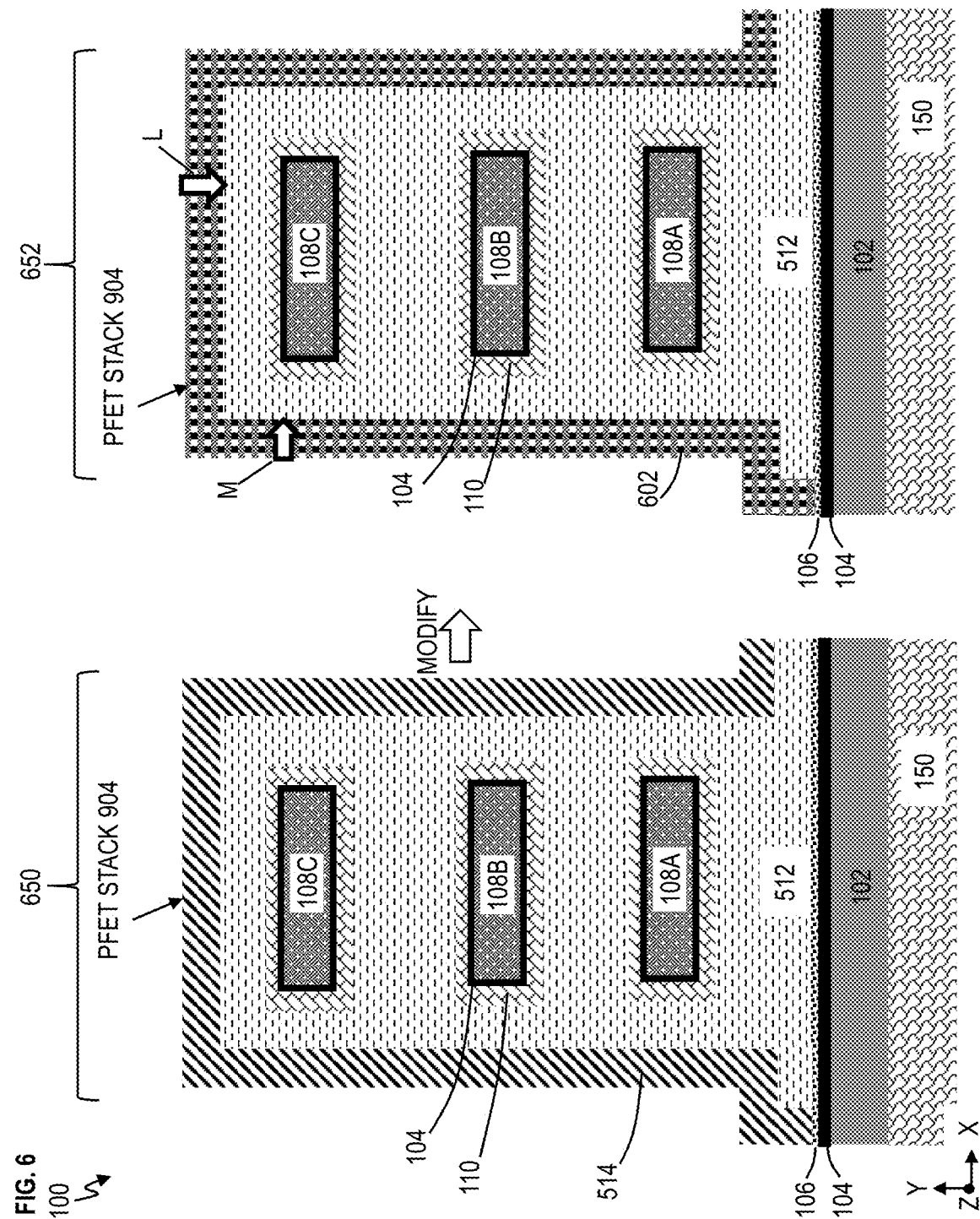
FIG. 6 depicts the results of performing fabrication operations configured and arranged to modify the effective work function of the semiconductor device according to embodiments of the invention.

FIG. 6 depicts modifying the effective work function of the semiconductor device 100 according to one or more embodiments of the invention. Another example of modifying the work function of the PFET 904 is illustrated, in which PFET 904 is shown prior to modification in the left view 650 and after modification in the right view 652.

Particularly, FIG. 6 illustrates modification of the layer 114 using plasma implantation/treatment. In some implementations, a portion of the metal 512 can also be modified, and in other implementations, only the layer 514 is modified. The atoms or ions used in the plasma implantation can include O and N. The atoms/ions are implanted in layer 514 (outside work function metal) and optionally in a portion of the work function metal 512 (inner work function metal), resulting in modified work function metal layer 602.

The metals 512 and 514 can be different materials. As one example, the metal 512 can be TiN and the layer 514 can be an NFET stack like tri-layer stack described in FIG. 1, and the modified work function metal layer stack 602 would be with a high concentration of O, N, Cl, F, etc., atoms/ions so that the NFET work function stack has high work function and cannot affect the work function of metal 512.

The atoms/ions can penetrate a depth of about 2-4 nm to form the modified work function metal layer 602. As can be seen, the modified work function metal layer 602 encompasses the (entirety of) work function metal 512. In some implementations, the modified work function metal layer 602 encompasses a portion of the first work function metal 512, which results in the size of the original first work function metal 512 (not having metal implanted) being reduced. By forming the modified work function metal layer 602, the modified PFET now has a uniform (or more uniform) threshold voltage. Particularly, the threshold voltages of the outer channel (e.g., channel A and sidewall channel) and inner channel (e.g., channels B, C, D, E, F) are the same (or substantially the same). As a result of this work function modification, the effective work function of the outer channel is lowered which correspondingly lowers the threshold voltage of the outer channel so as to match (or nearly match) the inner channel. For example, threshold voltage of channel A of the top nanosheet 108C matches (or nearly matches) the threshold voltage of respective channels B-F of nanosheets 108A and 108B. The work function modification does not increase the threshold voltage of the inner channel (of nanosheets 108A and 108B).

Figure 7:
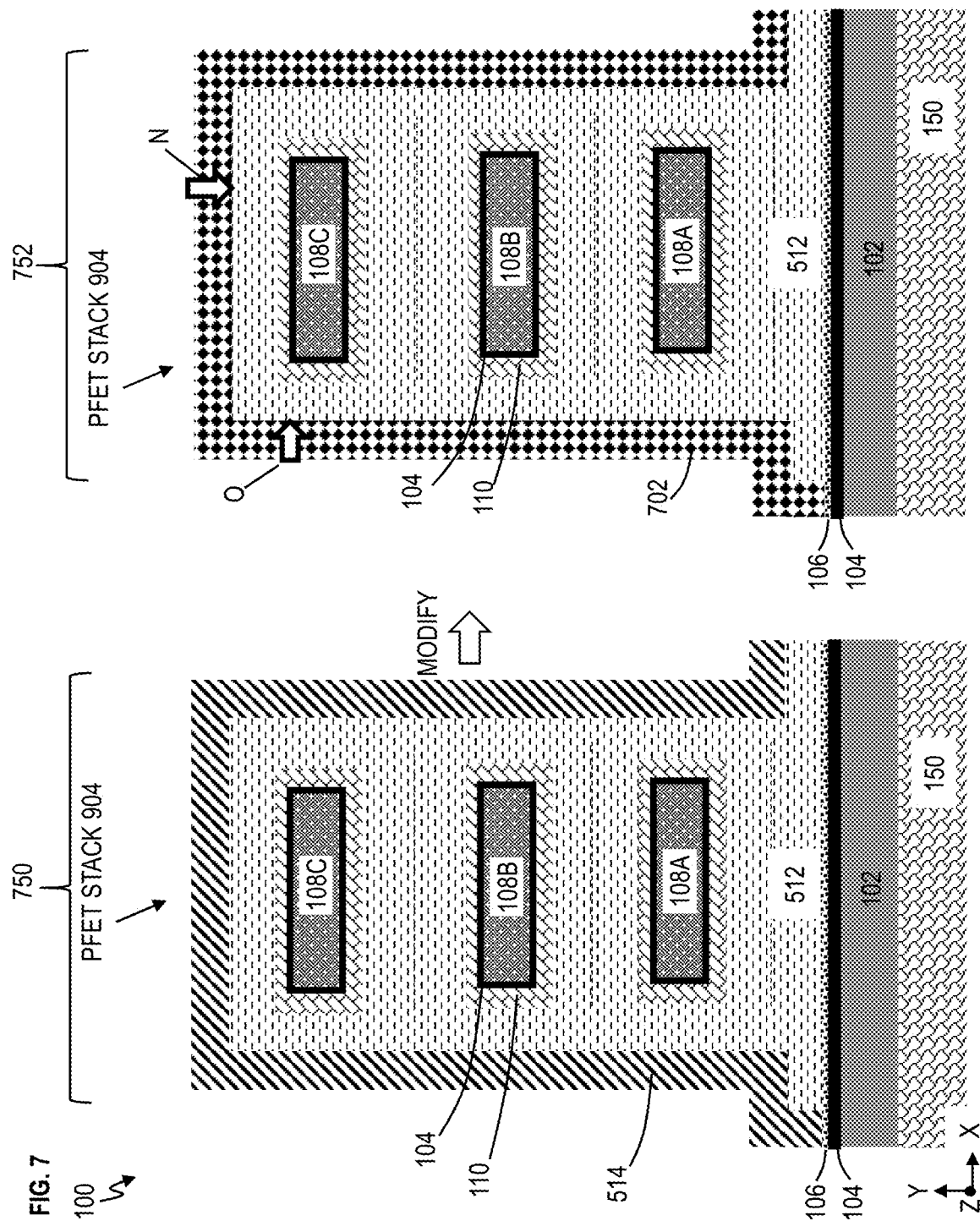
FIG. 7 depicts the results of performing fabrication operations configured and arranged to modify the effective work function of the semiconductor device according to embodiments of the invention.

FIG. 7 depicts modifying the effective work function of the semiconductor device 100 according to one or more embodiments of the invention. This is yet another example of modifying the work function of the PFET 904 in which the PFET 904 is shown prior to modification in the left view 750 and after modification in the right view 752. In particular, FIG. 7 illustrates modification of the layer 514 using thermal annealing or thermal drive-in in an oxygen environment and/or NH$_3$ (ammonia) environment. In some implementations, a portion of the work function metal 52 can also be modified, and in other implementations, only the layer 514 is modified. In the oxygen environment, the oxygen atoms/ions are thermally driven (or diffused) into the layer 514 (outside work function metal) and optionally a portion of the first work function metal 512 (inner work function metal), resulting in modified work function metal layer 702. In the NH$_3$ (ammonia) environment, the nitrogen atoms/ions are thermally driven (or diffused) into the layer 514 (outside work function metal) and optionally a portion of the work function metal 512 (inner work function metal), resulting in modified work function metal (layers) stack 702. In some implementations, thermal drive-in can performed for both the oxygen environment and NH$_3$ (ammonia) environment, where thermal drive-in occurs for one environment first and then the next environment, or vice versa.

As noted above, the modified work function metal layer stack 602 would be with a high concentration of O, N, Cl, F, etc., atoms/ions so that the NFET work function stack has a high work function and cannot affect the work function of metal 512. As can be seen, the modified work function metal layer 702 encompasses the (entirety of) metal stack 514. In some implementations, the modified work function metal layer 702 can encompass a portion of the first work function metal 512, which results in the size of the original first work function metal 512 (not having additional atoms/ions thermally driven-in) being reduced. By forming the modified work function metal layer 702, the modified PFET now has a uniform (or more uniform) threshold voltage. Particularly, the threshold voltages of the outer channel (e.g., channel A and sidewall channel) and inner channel (e.g., channels B, C, D, E, F) are the same (or substantially the same). As a result of this work function modification, the effective work function of the outer channel is lowered which correspondingly lowers the threshold voltage of the outer channel so as to match (or nearly match) the inner channel. For example, threshold voltage of channel A of the top nanosheet 108C matches (or nearly matches) the threshold voltage of respective channels B-F of nanosheets 108A and 108B. The work function modification does not increase the threshold voltage of the inner channel (of nanosheets 108A and 108B).

FIG. 8 depicts modifying the effective work function of the semiconductor device 100 according to one or more embodiments of the invention. Yet another example of modifying the work function of the PFET 904 is illustrated, in which PFET 904 is shown prior to modification in the left view 850 and after modification in the right view 852. Without requiring implantation or thermal drive-in to modify the work function metal 512 and the work function metal 514, a directional deposition technique is used to modify the effective work function in the PFET. The material deposited can be a directional nitride such as, for example, TiN, TaN, etc. One or more metals are deposited on top of the first work function metal 512 (inside work function metal), resulting in work function metal layer 802. The additional work function metal layer 802 is (only) formed on the top surface of the first work function metal 512 above the but not the sidewalls of the stack. Particularly, the additional work function metal layer 802 grows in the y-axis because of the directional deposition, and is sandwiched between the metal 512 and the NFET stack 514 above the top nanosheet 108C. The additional layer 802 counteracts or neutralizes the impact of the NFET stack 514 on work function metal 512. The height/thickness of the additional work function metal layer 802 ranges from about 2-5 nanometers in order to reduce the top surface threshold voltage to has a uniform (or more uniform) threshold voltage for nanosheet. Consequently, the threshold voltages of the outer channel (e.g., channel A and sidewall channel) and inner channel (e.g., channels B, C, D, E, F) are the same (or substantially the same). As a result of this work function modification, the effective work function of the outer channel is lowered which correspondingly lowers the threshold voltage of the outer channel so as to match (or nearly match) the inner channel. For example, threshold voltage of channel A of the top nanosheet 108C matches (or nearly matches) the threshold voltage of respective channels B-F of nanosheets 108A and 108B. The work function modification does not increase the threshold voltage of the inner channel (of nano sheets 108A and 108B).

In some implementations, the effective work function of the PFET can be modified using all the types of work function modifications in FIGS. 5-8 and/or any combination of two or more of the work function modifications. For example, beam/ion implantation in FIG. 5 can be utilized, plasma implantation/treatment in FIG. 6 can be utilized, thermal drive-in in FIG. 7 can be utilized, and/or direct deposition in FIG. 8 can be utilized (in any order) to create a modified work function metal as discussed herein. Similarly, in some implementations, the effective work function of the NFET can be modified using all the types of work function modifications in FIGS. 2-4 and/or any combination of two or more of the work function modifications. For example, beam/ion implantation in FIG. 2 can be utilized, plasma implantation/treatment in FIG. 3 can be utilized, and/or direct deposition in FIG. 4 can be utilized (in any order) to create a modified work function metal as discussed herein.

As noted above, FIG. 9 depicts an example of the semiconductor device 100 prior to modification as discussed in FIGS. 2-8 according to one or more embodiments of the invention. The semiconductor device 100 is an example of the initial structure and can be formed using standard lithographic as understood by one skilled in the art. Any and/or all of the modifications of the respective work function metals 114 and 514 can be performed on NFET stack 902 and PFET stack 904 of the semiconductor device 100. The circle in FIG. 9 is an example representation of the combination of layers 106, 112, and 114 as layer 514, although layer 514 can be more or fewer layers as discussed herein.

Figure 12A:
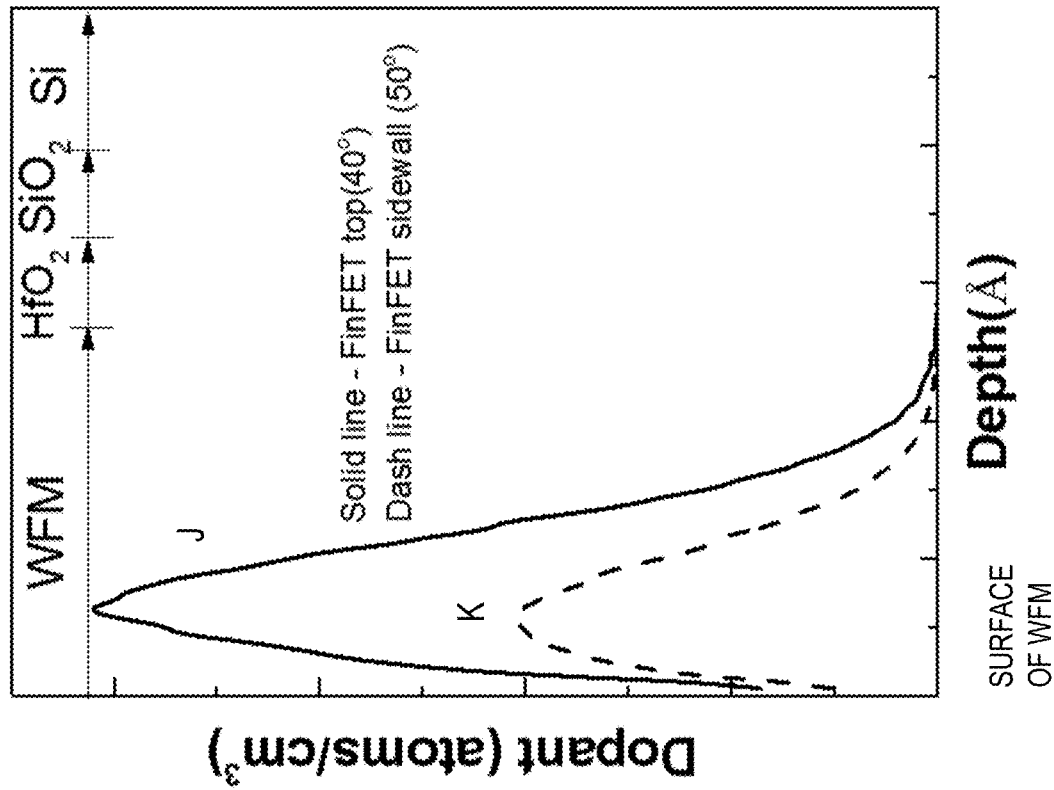
FIG. 12A depicts a chart according to according to embodiments of the invention.
Figure 12B:
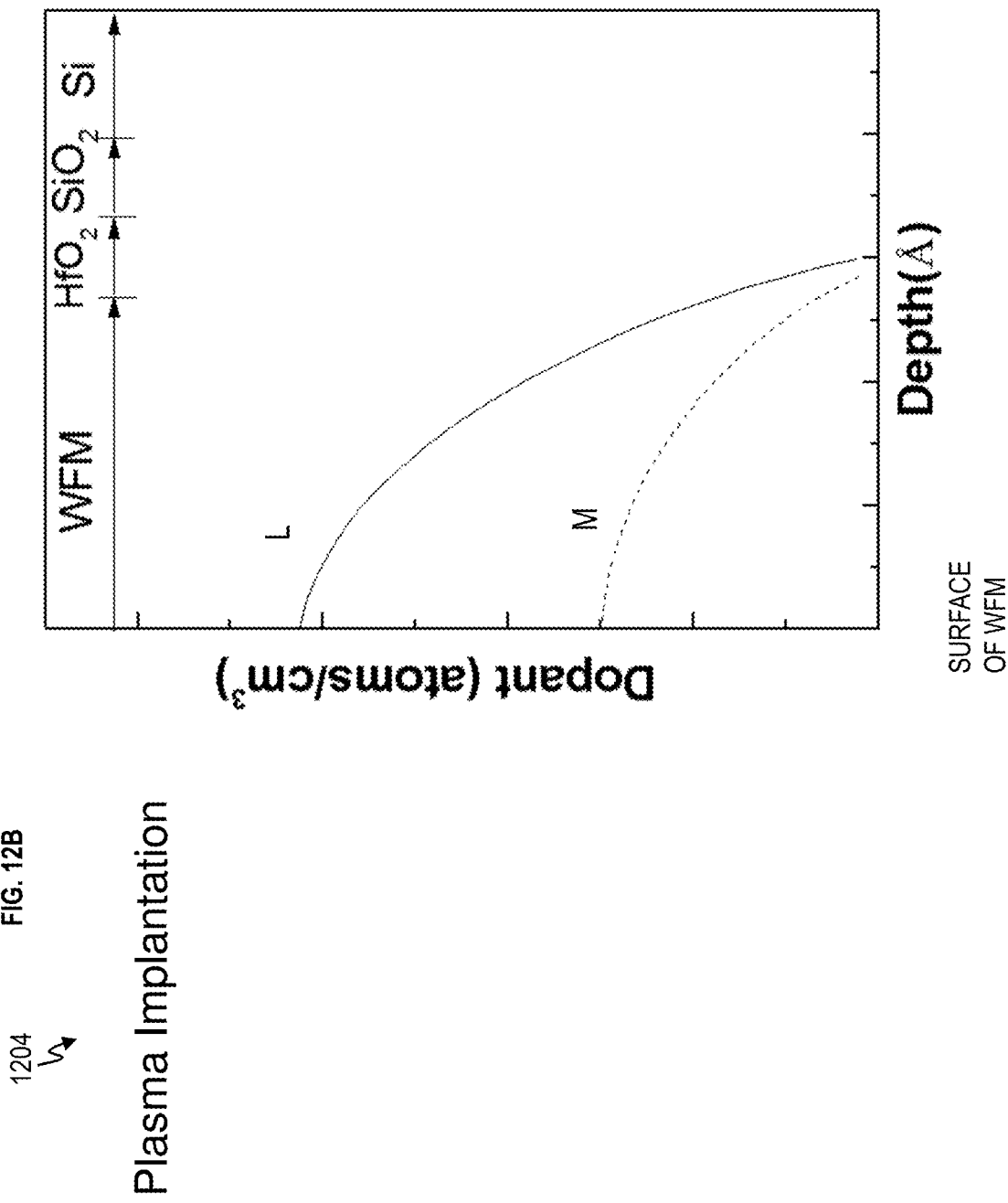
FIG. 12B depicts a chart according to according to embodiments of the invention.

Further, FIG. 12A depicts an example chart 1202 of ion implantation according to embodiments of the invention. FIG. 12B depicts an example chart 1204 of plasma implantation according to embodiments of the invention. FIG. 12C depicts an example chart 1206 of thermal diffusion according to embodiments of the invention. Since different techniques have different characteristics, different techniques generate different dopant profiles. Usually, the implant technique is going to generate a dopant peak under the work function metal surface as shown in FIG. 12A. Also, due to the double implant on the top surface (J), the top surface (J) will have more dopants than the sidewall (K). The dopant concentration is dependent on elements, ion energy, implantation angle, gate height, gate critical dimensions, and so on. In the plasma technique, the dopant profile depends on the plasma energy and gate geometry. Due to non-uniformity, usually the top surface (L) has a higher concentration than the sidewall (M), as shown in FIG. 12B. Thermal diffusion treatment is more uniform than other methods mentioned before. So, there is no clear difference between top surface (N) and sidewall (O) in FIG. 12C.

FIG. 10 depicts a flow chart of a method 1000 of fabricating a semiconductor device 100 according to one or more embodiments of the invention. At block 1002, the method 1000 includes providing an N-type field effect transistor (NFET) 902 and a P-type field effect transistor (PFET) 904, each having an inner work function metal (e.g., work function metal 112 and 512, respectively), an outer work function metal (e.g., second work function metal 114 and 514, respectively), a first nanosheet (e.g., nanosheet 108B and/or nanosheet 108C) including an inner channel surface (e.g., any inner channels C-F for nanosheets 108B and 108C and/or inner channel B for nanosheet 108A, as depicted in FIG. 1) having a first threshold voltage, and a second nanosheet (e.g., nanosheet 108C) including an outer channel surface (e.g., outer channel A and/or sidewall channel) having a second threshold voltage. Also, the method 1000 includes modifying the outer work function metal (e.g., second work function metal 114 in NFET and metal 514 in PFET) so as to cause the outer channel surface (e.g., outer channel A and/or sidewall channel) for the second nanosheet (e.g., nanosheet 108C) to have the second threshold voltage similar to or within a predefined amount of the first threshold voltage for the inner channel surface (which could be inner channels C-F and/or inner channel B) of the first nanosheet (e.g., nanosheets 108A and 108B and/or nanosheet 108C). The predefined amount is about 20 mV or less, 15 mV or less, 10 mV or less, 5 mV or less, 3 mV or less.

Modifying the outer work function metal (e.g., work function metal 114 in NFET and metal 514 in PFET) so as to cause outer channel surface (e.g., outer channel A and/or (outer) sidewall channel) of the second nanosheet (e.g., nanosheet 108C) to have the second threshold voltage similar to (or within a predefined amount of) the first threshold voltage for the inner channel surface (which can include channels C-F and/or inner channel B) of the first nanosheet includes implantation, for example, as depicted in FIG. 2 for NFET and FIG. 5 for PFET. The implantation includes implanting material in the outer work function metal, the material causing the second threshold voltage to change and become similar to the first threshold voltage.

Modifying the outer work function metal (e.g., work function metals 114 and 514) so as to cause the outer channel surface (e.g., outer channel A and/or (outer) sidewall channel) of the second nanosheet to have the second threshold voltage similar to (or within a predefined amount of) the first threshold voltage for the inner channel surface (e.g., inner channels C-F and/or inner channel B) of the first nanosheet includes plasma treatment, for example, as depicted in FIG. 3 for NFET and FIG. 6 for PFET. The plasma treatment includes doping the outer work function metal (e.g., second work function metal 114) with material that causes the second threshold voltage to change and become similar to the first threshold voltage.

Modifying the outer work function metal (e.g., work function metal 514) so as to cause outer channel surface of the second nanosheet to have the second threshold voltage similar to (or within a predefined amount of) inner channel surface of the first threshold voltage of the first nanosheet includes thermal annealing, for example, as depicted in FIG. 7 for PFET. The thermal annealing includes doping the outer work function metal (e.g., work function metal 514) with material that causes the second threshold voltage to change and become similar to the first threshold voltage. The thermal annealing thermally drives the material into the outer work function metal. The additional material in the outer work function metal is a uniform distribution of elements (e.g., oxygen and/or nitrogen atoms/ions) for the PFET.

Modifying the outer work function metal (e.g., second work function metals 114 and 514) so as to cause outer channel surface of the second nanosheet to have the second threshold voltage similar to (or within a predefined amount of) the first threshold voltage for the inner channel surface of the first nanosheet includes directional deposition, for example, as depicted in FIG. 4 for NFET and FIG. 8 for PFET. The directional deposition includes depositing material over (or above) the second nanosheet, the material causing the second threshold voltage to change and become similar to the first threshold voltage.

FIG. 11 depicts a flow chart of a method 1100 of treating a gate-all-around field effect transistor (i.e., the semiconductor device 100) according to one or more embodiments of the invention. At block 1102, the method 1100 includes providing at least one stack (e.g., the NFET 902 and/or the PFET 904) having an inner work function metal (e.g., first work function metal 112 and 512, respectively) and an outer work function metal (e.g., second work function metal 114 and 514, respectively). At block 1104, the method 1100 includes modifying the outer work function metal (e.g., second work function metal 114 and 514 with respect to NFET and PFET, respectively) so as to cause an outer threshold voltage of an outer channel (e.g., outer channel A and/or (outer) sidewall channel depicted in FIG. 1) to be similar to or within a predefined amount of an inner threshold voltage of an inner channel in the at least one stack (e.g., the NFET 902 and/or the PFET 904). The predefined amount is about 20 mV or less, 15 mV or less, 10 mV or less, 5 mV or less, 3 mV or less.

The at least one stack (e.g., the NFET 902 and/or the PFET 904) includes a first nanosheet (e.g., nanosheet 108A and/or 108B) including the inner channel having the inner threshold voltage and a second nanosheet (e.g., outer/top nanosheet 108C) having the outer threshold voltage. Modifying the outer work function metal (e.g., second work function metal 114 for NFET and metal 514 for PFET) so as to cause the outer threshold voltage of the outer channel to be similar to the inner threshold voltage of the inner channel includes performing a process, the process is selected from the group consisting of implantation of material in the outer work function metal (as depicted in FIGS. 2 and 5), plasma treatment to dope the material in the outer work function metal (as depicted in FIGS. 3 and 6), and/or thermal annealing to diffuse the material in the outer work function metal (as depicted in FIG. 7). The at least one stack includes a PFET 904 and an NFET 902. The material is different in the PFET and the NFET. Modifying the outer work function metal (e.g., second work function metal 114 and 514) so as to cause the outer threshold voltage of the outer channel to be similar to an inner threshold voltage of the inner channel in the at least one stack includes directional deposition of an additional layer of material (as depicted in FIGS. 4 and 8).

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
providing an N-type field effect transistor (NFET) and a P-type field effect transistor (PFET), each including an inner work function metal, an outer work function metal, a first nanosheet comprising an inner channel surface having a first threshold voltage, and a second nanosheet comprising an outer channel surface having a second threshold voltage; and
modifying the outer work function metal so as to cause the outer channel surface of the second nanosheet to have the second threshold voltage within a predefined amount of the first threshold voltage for the inner channel surface of the first nanosheet, the predefined amount being within about 20 millivolts (mV).

2. The method of claim 1, wherein modifying the outer work function metal so as to cause the outer channel surface of the second nanosheet to have the second threshold voltage be within the predefined amount of the first threshold voltage for the inner channel surface of the first nanosheet comprises implantation.

3. The method of claim 2, wherein the implantation comprises implanting material in the outer work function metal, the material causing the second threshold voltage to change and become within the predefined amount of the first threshold voltage.

4. The method of claim 1, wherein modifying the outer work function metal so as to cause the outer channel surface for the second nanosheet to have the second threshold voltage be within the predefined amount of the first threshold voltage for the inner channel surface of the first nanosheet comprises plasma treatment.

5. The method of claim 4, wherein the plasma treatment comprises doping the outer work function metal with material that causes the second threshold voltage to change and become within the predefined amount of the first threshold voltage.

6. The method of claim 1, wherein modifying the outer work function metal so as to cause the outer channel surface for the second nanosheet to have the second threshold voltage be within the predefined amount of the first threshold voltage for the inner channel surface of the first nanosheet comprises applying a thermal anneal.

7. The method of claim 6, wherein the thermal anneal comprises thermally driving material into the outer work function metal, the material causing the second threshold voltage to change and become within the predefined amount of the first threshold voltage.

8. The method of claim 1, wherein modifying the outer work function metal so as to cause the outer channel surface for the second nanosheet to have the second threshold voltage be within the predefined amount of the first threshold voltage for the inner channel surface of the first nanosheet comprises directional deposition.

9. The method of claim 8, wherein the directional deposition comprises depositing material over the second nanosheet, the material causing the second threshold voltage to change and become within the predefined amount of the first threshold voltage.

10. A method of treating a gate-all-around field effect transistor, the method comprising:
providing at least one stack comprising an inner work function metal and an outer work function metal; and
modifying the outer work function metal so as to cause an outer threshold voltage of an outer channel to be within a predefined amount of an inner threshold voltage of an inner channel in the at least one stack, the predefined amount being within about 20 millivolts (mV).

11. The method of claim 10, wherein the at least one stack comprises a first nanosheet comprising the inner channel having the inner threshold voltage and a second nanosheet comprising the outer channel surface having the outer threshold voltage.

12. The method of claim 10, wherein modifying the outer work function metal so as to cause the outer threshold voltage of the outer channel to be within the predefined amount of the inner threshold voltage of the inner channel comprises performing a process, the process is selected from the group consisting of implantation of material in the outer work function metal, plasma treatment to dope the material in the outer work function metal, and thermal annealing to diffuse the material in the outer work function metal.

13. The method of claim 12, wherein the at least one stack comprises a PFET and an NFET.

14. The method of claim 13, wherein the material is different in the PFET and the NFET.

15. The method of claim 10, wherein modifying the outer work function metal so as to cause the outer threshold voltage of the outer channel to be within the predefined amount of the inner threshold voltage of the inner channel in the at least one stack comprises directional deposition of an additional layer of material.

* * * * *